Dec. 17, 1968 YING-LUH YAO 3,417,262

PHANTOM OR CIRCUIT FOR INVERTERS HAVING ACTIVE LOAD DEVICES

Filed Jan. 19, 1965

| A | B | $E_0$ |
|---|---|---|
| H | H | L |
| H | L | H |
| L | H | H |
| L | L | H |

INVENTOR.
YING-LUH YAO

BY John V. Regan
Attorney

United States Patent Office 3,417,262
Patented Dec. 17, 1968

3,417,262

PHANTOM OR CIRCUIT FOR INVERTERS HAVING ACTIVE LOAD DEVICES

Ying-Luh Yao, Manville, N.J., assignor to Radio Corporation of America, a corporation of Delaware Filed Jan. 19, 1965, Ser. No. 426,489
7 Claims. (Cl. 307—218)

ABSTRACT OF THE DISCLOSURE

Phantom OR connection of inverting type switching elements having active load devices: Two or more diode-transistor logic elements having active collector loads are interconnected in a phantom OR arrangement. Each element includes an inverter transistor, an active collector load transistor and a level control circuit responsive to an applied input signal being at one and the other of two digital levels to cause the inverter and load transistors, respectively, to control the significance of an output voltage at an output connection. The phantom OR circuit is obtained by directly connecting the output of each element together and by directly connecting the bases of all the active load transistors together for commonly controlling the conductivities of all the load transistors in response to any of the input signals changing from the one to the other of the digital levels.

Figures 1, 2:
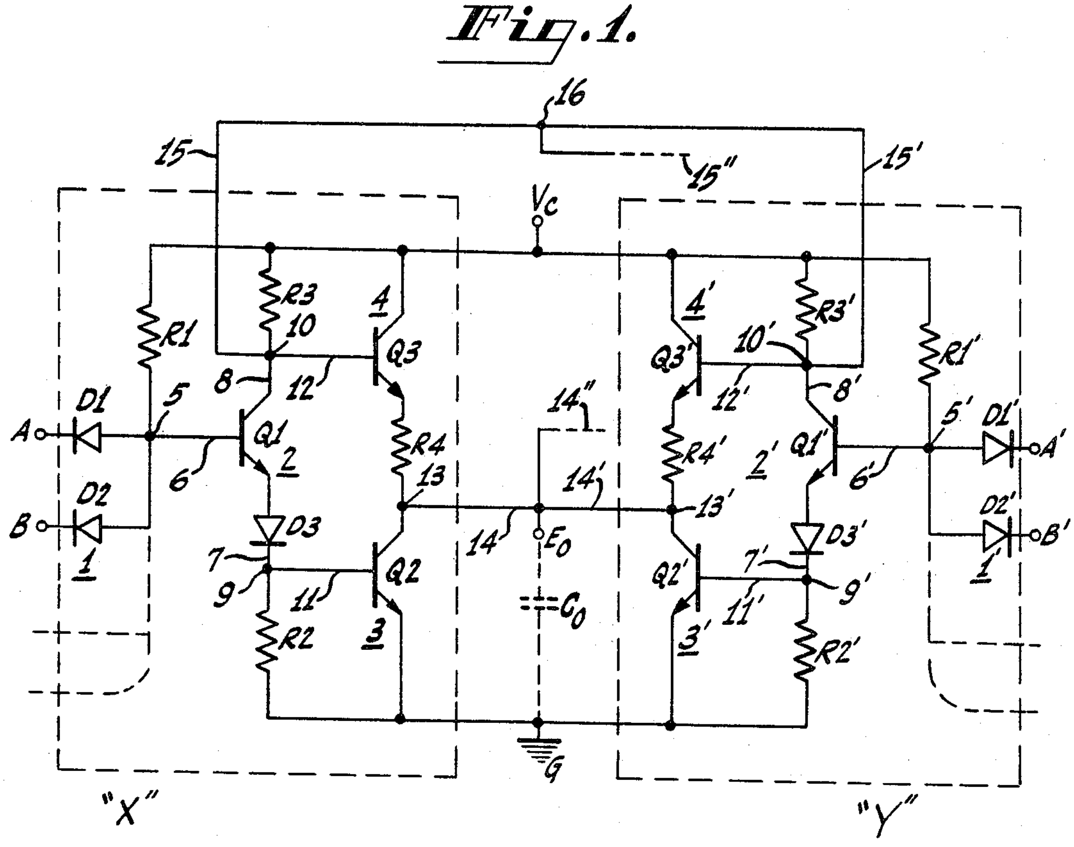

This invention relates to electronic circuitry, and more particularly to circuitry for performing logical operations.

While logic circuits have varied applications, they are used extensively in switching and computer apparatus for the internal routing of information. Such information in the form of electrical signals is generally guided through desired circuit paths by means of elementary logic circuitry. Logical operations performed by such circuitry include NAND and NOR functions.

These logic elements may be fabricated in microminiature packages, for example, one of the monolithic type. Due to the compactness of the circuit components used in the logic elements, heat dissipation, particularly in resistive components, can be critical. Consequently, such resistive components are often replaced with active networks. One such replacement, for example, is the connection of a transistor as an active load in place of the collector load resistor of another transistor.

In the design of data processing apparatus, the logic elements generally are interconnected in complex networks. One type of interconnection is to directly connect the outputs of two or more logic elements together in such manner that an OR function is achieved at a common output. The common output signal is present when any one or more of the logic elements produces an output. Such interconnected elements perform a so-called phantom or virtual OR function.

Prior to this invention, the interconnection of microminiature circuits having active collector loads required the connection of the output of each logic element to an extra gating circuit. The extra gating circuit was necessary in order to avoid an unstable condition which exists when the outputs of two logic elements are directly connected together. The prior arrangement introduces an additional time delay in the propagation of the information and also requires additional area or space for the extra gate circuit. Moreover, the requirement for the extra gate circuits can be quite expensive as numerous phantom OR connections often are required in a data processing system.

It is an object of this invention to provide an interconnection of logical elements to form a phantom OR circuit.

It is another object of this invention to provide a relatively inexpensive phantom OR circuit which does not require an extra gate circuit.

It is still another object of this invention to provide an improved phantom OR circuit having an improved response time over prior art circuits of similar type.

In accordance with this invention, there is provided a phantom OR circuit interconnecting a plurality of logic elements wherein each logic element has first and second active networks each having at least two terminals defining a conduction path and a gate means for controlling the conductivity of the path. One terminal of each active network is coupled to a circuit junction. For each logic element there is provided a level control circuit having two operating states, conducting and non-conducting, and having first and second outputs. The first output of the level control circuit is coupled to the gate means of the first active network.

The phantom OR interconnections are accomplished by coupling the circuit junctions of each logic element in common to an output and also by coupling the second outputs of each of the level control circuits and the gate means of the second active networks to a common junction such that the voltage level at the junction is at one level when any one of the level control circuits is conducting and at another level when all of the level control circuits are not conducting. Means are provided for biasing the active networks and the level control circuits. Input signal means are provided to apply input signals to each of the level control circuits.

In a specific embodiment of the invention each of the active networks is a transistor. The collectors of the first transistors of each logic element, corresponding to the first active networks, are coupled together in common to an output. The level control circuit is also a transistor having its emitter coupled to the base of the first transistor and its collector coupled to the base of a second transistor, corresponding to the second active network. Means are provided for coupling the bases of the second transistors together in common. Input signals are applied through diode gates to the bases of each of the level control transistors.

FIG. 1 is a circuit diagram of two logic elements interconnected in a phantom OR arrangement; and FIG. 2 is a truth table for either one of the logic elements described in FIG. 1.

Referring now to FIG. 1, there are illustrated two logic elements X and Y indicated generally by the dotted line enclosures. Logic element X includes a diode gate 1, a level control circuit 2, active network 3, and active network 4. Although diode gate 1 is illustrated as having two diodes D1 and D2 having their anodes coupled to a junction 5, it is apparent to those skilled in the art that more than two diodes could be so coupled as indicated by the dotted lines. The cathodes of diodes D1 and D2 are coupled to data inputs A and B respectively. Also coupled to the junction 5 is a source of operating potential $V_c$ through a resistor R1.

A further connection to the junction 5 is the input 6 of the level control circuit 2. Level control circuit 2 is illustrated as being a transistor Q1 having its base coupled by means of input 6 to junction 5. The emitter of transistor Q1 is coupled through a diode D3 to a fir t output 7 of the level control circuit. The diode 7 is poled in the conventional sense from the emitter to the output 7. The collector of transistor Q1 is coupled to a second output 8 of the level control circuit. The first and second outputs 7 and 8 of the level control circuit are coupled to junctions 9 and 10 respectively. Junction 9 is also coupled through a resistance R2 to a reference level G, indicated in the drawing by the conventional ground symbol. Junction 10 is coupled to the bias source $V_c$ through a resistor R3.

Junction 9 is further coupled to an input or gate means 11 of active network 3. Junction 10 is further coupled to an input or gate means 12 of the second active network 4. Active networks 3 and 4 are illustrated as being transistors Q2 and Q3 respectively. The bases of transistors Q2 and Q3 are coupled through inputs 11 and 12 to junctions 9 and 10 respectively. The emitter of transistor Q2 is coupled to the reference potential G. The collector of transistor Q2 is coupled to a circuit junction 13. The emitter of transistor Q3 is coupled to circuit junction 13 through a resistor R4. The collector of transistor Q3 is coupled to bias source $V_c$.

Since logic element Y is identical to logic element X, the same reference numerals and letters used to describe element X are used with primes to describe the like components in element Y.

Logic elements of X and Y are connected to form a phantom OR circuit by coupling junctions 13 and 13' by means of outputs 14 and 14' respectively to a common output terminal $E_o$. The junctions 10 and 10' are connected together to a common junction 16 by coupling means 15 and 15' respectively. The connections 14'' and 15'' to output $E_o$ and to junction 16 represent the connections of identical logic elements. The capacitance $C_o$ illustrated by the dotted connection between output $E_o$ and ground represents stray capacitance due to wiring, and the input capacitance of a further logic element to which output $E_o$ may be connected.

For illustrative purposes assume that bias potential $V_c$ is +5 volts, that the base emitter junction diode voltage drop ($V_{BE}$) of each transistor is 0.7 volt, that the voltage drop across the collector emitter circuit ($V_{CE}$) of each transistor is 0.1 volt during saturation, that the voltage drop across any of the diodes is 0.7 volt when conducting, and that the inputs A and B and the output $E_o$ are either 0.1 volt or 4.3 volts. Assume also that the output $E_o$ is coupled to the input of a similar logic element.

Consider first the operation of logic element X without the phantom OR connections 14 and 15. When either input A, or B, or both, is at the 0.1 volt level, the corresponding diode, or diodes D1 or D2 is, or are, conducting. The base of level control transistor Q1 at junction 5 is at 0.8 volt which potential level is insufficient to break down the base emitter junction of transistor Q1 and the threshold of diode D3. Therefore, transistor Q1 is cut off and supplies no current to the base of transistor Q2. Thus transistor Q2 is also cut off. The base of transistor Q3, junction 10, and level control output 8 are drawn toward the bias voltage of 5 volts. Transistor Q3 conducts heavily and supplies charging current for the output capacitance $C_o$. As the output capacitance $C_o$ charges, the output $E_o$ rises from 0.1 to 4.3 volts. When the output $E_o$ levels off at 4.3 volts, very little current is drawn through transistor Q3 because the input diode of the logic gate coupled to the output is reverse biased. Consequently, when either input A, or input B, or both, is at 0.1 volt, the output $E_o$ at junction 13 is at 4.3 volts.

When both inputs A and B are at 4.3 volts, neither of the diodes D1 and D2 conducts. The voltage level at the base of level control transistor Q1 rises to 2.1 volts (the sum of the voltage drops across the base emitter junctions of transistors Q1 and Q2 and across diode D3), exceeding the threshold presented by the base emitter junction of transistor Q1 and diode D3. Transistor Q1 saturates and supplies current to the base of transistor Q2 driving the latter transistor into saturation. The output at junction 13 drops to 0.1 volt ($C_{CE}$ of the saturated transistor Q2). The base of transistor Q3 is drawn from 5 volts to 1.5 volts. The voltage of the emitter of transistor Q3 follows the base voltage and is at 0.8 volt ($V_B - V_{BE}$ of transistor Q3). Since the output junction 13 is coupled to a like logic element, the D.C. load impedance is relatively low because the input diode of the load is forward biased. Therefore, current is drawn through transistor Q3 resulting in a 0.7 volt drop across current limiting resistance R4. Consequently, when both input A and input B are at 4.3 volts, the output $E_o$ at junction 13 is at 0.1 volt.

Diode D3 is important and advantageous to the operation of the logic element. It serves not only to provide a proper level drop but also to provide improved noise protection for variations of the input voltage for approximately a 1.3 volt swing from the 0.1 volt level. Diode D3, being a fast recovery diode, turns off very rapidly when the input voltage A or B drops from 4.3 to 0.1 volt resulting in a rapid turnoff time for transistor Q1. A rapid turnoff time of transistor Q1 is desirable in order to obtain a more rapid response by output $E_o$ to changes in voltage level at inputs A and B.

A further aid to the description of the logic element is the truth table illustrated in FIG. 2 for two inputs A and B. The letters H and L represent high and low voltage levels, respectively. The output $E_o$ is at the low level only when all inputs are at the high level and is at the high level when any one of more of the inputs is at the low level. Accordingly, the logic element performs a NAND function for high value signals and a NOR function for low value signals.

The operation of logic element Y is identical to that of logic element X and therefore need not be described in detail except insofar as the operation of the two logic elements cooperate in the phantom OR circuit.

The phantom OR circuit operates as follows. When either of the inputs A or B to logic element X is at 0.1 volt and when either one of the inputs A' or B' to logic element Y is at 0.1 volt, transistors Q1, Q2, Q1' and Q2' are cut off as explained in the description of the operation of logic element X. The bases of transistors Q3 and Q3' are drawn toward 5 volts. The voltage levels of the emitters of these two transistors follow the base voltages and are at 4.3 volts. When the output connection $E_o$ is coupled to another logic element, the load impedance is very large because the input diode of the load is reverse biased. Very little current is drawn through the transistors Q3 and Q3' and the voltage at the output connection $E_o$ is 4.3 volts. Consequently, when one of the inputs to each logic element X and Y is at 0.1 volt, the output $E_o$ is at 4.3 volts.

When both inputs A and B to logic element X are at 4.3 volts, transistors Q1 and Q2 saturate as heretofore described. Consider now that one or more of the inputs A' and B' to logic element Y is at the 0.1 voltage level. In such case the base of transistor Q3' or junction 10' would ordinarily be drawn toward the bias supply of 5 volts resulting in transistor Q3' conducting very heavily. Since transistor Q2 of logic element X is saturated, a very large current would be drawn through the series connection of the two transistors Q2 and Q3'. The collector of transistor Q2 would try to rise to some level of equilibrium There would be high power dissipation in both transistors Q2 and Q3' resulting in possible damage to both transistors. Consequently, such a circuit would be very unstable.

The phantom OR connections 15, 15' and 16 prevent the above-mentioned unstable condition. When the transistors Q1 and Q2 of logic element X are saturated, the voltage level at junction 16 is drawn to 1.5 volts thereby placing each of the transistors Q3 and Q3' in a state of relatively low conductivity. The charging current supplied to the load capacitance is now divided between the collector emitter circuits of the transistors Q3 and Q3'. The output voltage $E_o$ is at 0.1 volt ($V_{CE}$ of saturated transistor Q2) above reference level G.

Likewise, whenever the inputs A' and B' to logic element Y are at 4.3 volts and when one or more of the inputs A or B to logic element X is at 0.1 volt, the transistors Q3 and Q3' are in the relatively low conductivity state sharing the current supplied to the output $E_o$. Consequently, when any one of the level control transistors Q1 or Q1' is conducting, the common junction 16 is at one voltage level; and when all the level control transistors are not conducting, the common junction 16 is at another voltage level. These two voltage levels at junction 16 control the conductivity of the active network transistors so that a stable phantom OR circuit operation is obtained.

It is apparent to those skilled in the art that although the transistors are all described as being of the NPN type, transistors of the PNP type could be used along with the appropriate changes in polarity of the bias supply. It is also apparent to those skilled in the art that the active networks 4 and 4' of each of the logic elements X and Y may have several active components so long as the input 12 controls the conductivity of the output of the active network. Moreover, it is apparent to those skilled in the art that the level control circuit 2 could be any interconnection of circuit components which permits junction 9 to follow the swing of the input voltage while inverting the swing of the input voltage at junction 10. It is further apparent to those skilled in the art that although the invention has been described as being two logic elements interconnected in a phantom OR circuit, more than two such logic elements may have their output junctions 13 coupled to the output terminal $E_0$ and their circuit junctions 10 coupled to common junction 16 as illustrated by connections 14'' and 15''. The number of logic elements which can be so connected is limited only by the fan-out capability of the individual level control circuits 2.

What is claimed is:

1. The combination comprising input signal connections including first and second connections for receiving first and second bilevel input signals, respectively;

first and second switching elements each including an output connection and first and second active networks each having a conduction path and a control electrode for controlling the conductivity of the path, in each element, the conduction paths of the first and second networks being coupled to the associated output connection, each element further including a level control circuit coupled to a respective one of the input connections and being responsive to the associated input signal being at one and the other of its levels to cause the first and second networks, respectively, to control the significance of an output voltage at the associated output connection; and means for interconnecting said elements in a phantom OR configuration to provide an output signal having a first significance corresponding to any of said input signals being at said one level and having a second significance corresponding to all of said input signals being at said other level, said interconnecting means including a common output connection coupled to the output connection of each element and further including a common level control connection coupled to each of the level control circuits for commonly controlling the conductivities of all the second networks in response to any of said input signals changing from said one to said other level.

2. The invention according to claim 1 wherein the first active network in each element is a first transistor having a collector-emitter path and a base electrode corresponding to the conduction path and control electrode, respectively, of the first network.

3. The invention according to claim 2 wherein the level control circuit in each element is a transistor having a base electrode coupled to the corresponding input connection, an emitter electrode coupled to the base electrode of the corresponding first transistor and a collector electrode coupled to the control electrode of the corresponding second active network.

4. The invention according to claim 1 wherein the first and second active networks in each element are first and second transistors, respectively, each transistor having a collector-emitter path and a base electrode corresponding to the conduction path and control electrode, respectively.

5. The invention according to claim 4 wherein the level control circuit in each element is a third transistor having a base electrode coupled to the corresponding input connection, an emitter electrode coupled to the base electrode of the corresponding first transistor and a collector electrode coupled to the base electrode of the corresponding second transistor.

6. The invention according to claim 5 wherein the level control circuit further includes a diode connected between the emitter of the third transistor and the base of the first transistor for current flow in the same direction as the base-emitter junction of the third transistor.

7. The invention according to claim 6 wherein the first and second input signal levels are produced by first and second input signal gating means, each gating means responding to combinations of plural input signals to produce the corresponding first and second input signals.

References Cited

Electronics Magazine, Mar. 22, 1965, p. 21, "Integrated Circuits."

Electronics Magazine, Apr. 26, 1963, p. 31, "Dual NAND Gate."

Motorola Semiconductors Brochure on Integrated Circuits, "MC301G," #DS9006, printed August 1963.

IBM Technical Disclosure Bulletin, vol. 6, No. 12, May 1964, p. 28, "Complementary Output Circuit Using All NPN's."

Electronics Magazine, Oct. 4, 1963, pp. 23–26, "Choosing Logic for Microelectronics."

ARTHUR GAUSS, *Primary Examiner.*

ROBERT H. PLOTKIN, *Assistant Examiner.*

U.S. Cl. X.R.

307—207, 213, 215; 328—93, 94